US008619467B2

(12) United States Patent
Torok et al.

(10) Patent No.: US 8,619,467 B2
(45) Date of Patent: Dec. 31, 2013

(54) HIGH GMR STRUCTURE WITH LOW DRIVE FIELDS

(75) Inventors: E. James Torok, Shoreview, MN (US); Richard Spitzer, Berkeley, CA (US); David L. Fleming, Cortez, FL (US); Edward Wuori, Saint Paul, MN (US)

(73) Assignee: Integrated Magnetoelectronics, Berkeley, CA (US)

( * ) Notice: Subject to any disclaimer, the term of this patent is extended or adjusted under 35 U.S.C. 154(b) by 189 days.

(21) Appl. No.: 13/030,602

(22) Filed: Feb. 18, 2011

(65) Prior Publication Data

US 2011/0211388 A1 Sep. 1, 2011

Related U.S. Application Data

(60) Provisional application No. 61/306,896, filed on Feb. 22, 2010.

(51) Int. Cl.
*H01L 27/22* (2006.01)

(52) U.S. Cl.
USPC ........... 365/158; 365/202; 365/173; 257/295; 257/E21.665; 257/E27.005; 257/E43.004; 257/421; 427/548; 427/131; 427/132; 360/324

(58) Field of Classification Search
USPC ........... 365/173, 158; 360/324, 313; 427/548; 438/171; 257/E21.665, E27.005
See application file for complete search history.

(56) References Cited

U.S. PATENT DOCUMENTS

| 5,587,943 | A | * | 12/1996 | Torok et al. ........... 365/158 |
| 5,929,636 | A | | 7/1999 | Torok et al. |
| 6,031,273 | A | | 2/2000 | Torok et al. |
| 6,129,957 | A | * | 10/2000 | Xiao et al. ........... 427/548 |
| 6,469,927 | B2 | * | 10/2002 | Spitzer et al. ........... 365/173 |
| 6,483,740 | B1 | * | 11/2002 | Spitzer et al. ........... 365/158 |
| 6,573,713 | B2 | | 6/2003 | Torok et al. |
| 6,594,175 | B2 | | 7/2003 | Torok et al. |
| 6,859,063 | B2 | | 2/2005 | Nuspl et al. |
| 6,865,109 | B2 | | 3/2005 | Covington |
| 6,992,919 | B2 | | 1/2006 | Andrei et al. |
| 7,224,566 | B2 | | 5/2007 | Barna et al. |
| 7,911,830 | B2 | | 3/2011 | Torok et al. |
| 2002/0024842 | A1 | * | 2/2002 | Spitzer et al. ........... 365/173 |
| 2002/0029462 | A1 | * | 3/2002 | Spitzer et al. ........... 29/603.07 |
| 2002/0154455 | A1 | * | 10/2002 | Lenssen ........... 360/324 |
| 2004/0075152 | A1 | * | 4/2004 | Barna et al. ........... 257/421 |
| 2004/0136231 | A1 | * | 7/2004 | Huai et al. ........... 365/158 |
| 2005/0083743 | A1 | * | 4/2005 | Andrei et al. ........... 365/202 |
| 2005/0248888 | A1 | * | 11/2005 | Dieny et al. ........... 360/324 |
| 2005/0269612 | A1 | * | 12/2005 | Torok et al. ........... 257/295 |
| 2008/0285331 | A1 | | 11/2008 | Torok et al. |
| 2009/0244957 | A1 | | 10/2009 | Clinton et al. |
| 2011/0211388 | A1 | * | 9/2011 | Torok et al. ........... 365/158 |

OTHER PUBLICATIONS

International Search Report dated May 5, 2011, Application No. PCT/US11/25448.

(Continued)

*Primary Examiner* — Jerome Jackson, Jr.
*Assistant Examiner* — Bo Fan
(74) *Attorney, Agent, or Firm* — Weaver Austin Villeneuve & Sampson LLP

(57) ABSTRACT

Multi-period structures exhibiting giant magnetoresistance (GMR) are described in which the exchange coupling across the active interfaces of the structure is ferromagnetic.

29 Claims, 5 Drawing Sheets

(56) References Cited

OTHER PUBLICATIONS

International Search Report and Written Opinion of the ISA dated May 5, 2011, International Application No. PCT/US11/25448.

S. M. Bedair, et al., "Spintronic Memories to Revolutionize Data Storage", IEEE Spectrum, Nov. 2010, pp. 1-5.

W. H. Butler, et al., Physical Review B, "Spin-dependent tunning conductance of Fe/MgO/Fe sandwiches", vol. 63,054416, 2001, pp. 054416-1-054416-12.

R. J. Celotta, et al., Journal of Magnetism and Magnetic Materials, Oscillatory magnetic coupling in Fe/Ag/Fe(100) sandwich structures 127:205-213 (1993).

U.S. Appl. No. 13/030,602, filed Feb. 18, 2011, Torok et al.

T. Choy, "Electron Transport Theory in Magnetic Nanostructures", A Dissertation presented to the Graduate School of the University of Florida, 2001.

J. Colino, et al., Physical Review B, "Connection between giant magnetoresistance and structure in molecular-beam epitaxy and sputtered Fe/Cr superlattices", vol. 53, No. 2, Jan. 1, 1996, pp. 766-769.

S. D. Darma, American Scientist, "Spintronic", vol. 89, 2001, 516.

S. Ikeda, et al., Applied Physics Letters, "Tunnel magnetoresistance of 604% at 300 K by suppression of Ta diffusion in CoFeB/MgO/CoFeB pseudo-spin-valves annealed at high temperature", vol. 93, 082508, 2008, 4 pp.

L. Jiang, et al., Applied Physics Express, vol. 2, 083002, pp. 083002-1-083002-3.

J. Mathon, et al., "Physical Review B," Theory of tunneling magnetoresistance of an epitaxial Fe/MgO/Fe(001) junction, vol. 63, 220403(R), 2001, pp. 220403-1-220403-4.

C. H. Marrows, et al., J. Phys: Condens, "Giant Magnetoresistance and Oscillatory Exchange Coupling in Disordered Co/Cu multilayers", vol. 11, 1999, pp. 81-88.

C. H. Marrows, et al. "Finite size scaling effects in giant magnetoresistance multilayers", vol. 18, 2006, pp. 243-252.

C. H. Marrows, et al., Physical Review B., Impurity Scattering from δ-layers in giant magnetoresistance systems, vol. 63, 220405-1 to 220405-.

S. S. Park, et al., "Giant tunneling magnetoresistance at room temperature with MgO (100) tunnel barriers", Nature Materials, vol. 3, Dec. 2004, pp. 862-867.

S. S. Parkin, Physical Review Letters, "Origin of Enhanced Magnetoresistance of Magnetic Multilayers: Spin-Dependent Scattering from Magnetic Interface States", vol. 71, No. 10, Sep. 6, 1993, pp. 1641-1644.

S. S. Parkin, Appl. Phys. Left., "Giant magnetoresistance in antiferromagnetic Co/Cu multilayers", vol. 58, No. 23, Jun. 10, 1991, pp. 2710-2712.

S. A. Wolf, et al., Science, "Spintronics: A Spin-Based Vision for the Future", vol. 294, 2001, p. 1488.

S. Yuasa, et al., Nature Materials, "Giant Room-temperature magnetoresistance in single-crystal Fe/MgO/Fe magnetic tunnel junctions", vol. 3, Dec. 2004, pp. 868-871.

T. Shinjo and H. Yamamoto, Journal of the Physical Society of Japan, "Large Magnetoresistance of Field-Induced Giant Ferrimagnetic Multilayers", vol. 59, No. 9, Sep. 1990, pp. 3061-3064.

G. Zorpette, IEEE Spectrum, "The Quest for the Spin Transistor", vol. 38, Dec. 2001, pp. 30-35.

H. Kano, et al., Appl. Phys. Lett., "Substrate temperature effect on giant magnetoresistanc eof sputtered Co/Cu multilayers", vol. 63, No. 20, Nov. 15, 1993, pp. 2839-2841.

Spitzer and Wuoi, Demagnetizing Fields in Magnetic RAM, Dec. 2008, Integrated Magneto-Electronics Dec. 2008.

Sousa, et al., "Non-volatile magnetic random access memories (MRAM)", Physics, Oct. 25, 2005, preprint submitted to Elsevier Science, 10 pages.

Dieny, et al., "Spin-transfer effect anditsuse in spintronic components", Int. J. Nanotechnol, vol. 7, Nos. 4/5/6/7/8, 2010, pp. 591-613.

Prejbeanu, et al., "Thermally assisted MRAM", J. Phys.: Condens Matter, 2007, pp. 1-26.

Albon, C., "Integration of tunneling magnetoresistive sensors for high resolutive magnetic particle detection", PhD Thesis in Physics, Department of Physics, Bielefeld University (Nov. 2009), 128 pages.

Buschow, K.H.J., "Handbook of Magnetic Materials", vol. 17, Elsevier Science (Dec. 2007), 596 pages.

Gallagher, W.J. et al., "High-Speed 128Kbit MRAM Core in a 0.18μm CMOS Technology Utilizing PtMn-based Magnetic Tunnel Junctions", Non-Volatile Memory Technology Symposium, NVMTS (Nov. 2003). 27 pages.

Gallagher, W.J. et al., "Development of the magnet tunnel junction MRAM at IBM: From first junctions to a 16-Mb MRMA demonstrator chip", IBM J. Res. & Dev. vol. 50-No. 1 (Jan. 2006), 20 pages.

Klostermann, U.K. et al., "Influence of a magnetic seed line on the switching behaviour of submicrometre sized magnetic tunnel junctions", published online at stacks.iop.org/JPhysD/34/2117 (Jul. 2001), pp. 2117-2122.

Marrows, C.H. et al., "Giant magnetoresistance and oscillatory exchange coupling in disordered Co/Cu multilayers", J. Phys.: Condens. Matter 11 81 (1999), pp. 81-88.

Parkin, S., "Spin-Polarized Current in Spin Valves and Magnetic Tunnel Junctions", Abstract, MRS Bulletin, vol. 31 (May 2006), pp. 389-394.

Richter, R., "Logic gates realized with spin dependent tunneling elements", Dissertation; Department of Physics, Bielefeld University (Sep. 2002), 125 pages.

Schmalhorst, J. et al, "Temperature stability of Co/AI2O3/Co junctions", J Appl. Phys. vol. 87, No. 9 (May 2000), pp. 5191.

Schmalhorst, J. et al, "Switching stability of magnetic tunnel junctions with an artificial antiferromagnet", J Appl. Phys. vol. 77, No. 21 (Nov. 2000), pp. 3456.

Zhu, J. et al, "Ultrahigh density vertical magnetoresistive random access memory (invited)", J Appl. Phys. vol. 87, No. 9 (May 2000), pp. 6668.

* cited by examiner

HIGH GMR STRUCTURE WITH LOW DRIVE FIELDS

RELATED APPLICATION DATA

The present application is a non-provisional application of and claims priority under 35 U.S.C. 119(e) to U.S. Provisional Patent Application No. 61/306,896 for INTEGRATED MAGNETOELECTRONICS (IME) HIGH GMR filed Feb. 22, 2010, the entire disclosure of which is incorporated herein by reference for all purposes.

BACKGROUND OF THE INVENTION

The present invention relates to multi-period, thin-film structures exhibiting giant magnetoresistance.

Magnetoresistance refers to the dependence of the resistance of ferromagnetic materials on the relative orientation of the current and magnetization directions. There are several "flavors" of magnetoresistance, each being attributed to different underlying mechanisms. Technology developed in recent years by Integrated Magnetoelectronics (IME) of Berkeley, Calif., is based on layered magnetic structures characterized by either giant magnetoresistance (GMR) or tunnel magnetoresistance (TMR); collectively, quantum magnetoresistance (QMR). See, for example, the U.S. patent documents incorporated by reference below. This technology includes both magnetic memories and magnetic circuits; the latter being based on the Transpinnor®, IME's proprietary solid-state circuit component that can replace a variety of semiconductor components, including the semiconductor transistor.

Optimal performance of QMR devices calls for QMR structures with low drive fields and high values of QMR. There has been substantial activity in the development of TMR structures over the past decade, driven in large measure by theoretical predictions that TMR values of 1000% or more should be realizable in structures in which the amorphous $Al_2O_3$ barrier layer that was originally used is replaced with a polycrystalline MgO barrier layer. Several experimental groups have achieved room-temperature values up to 220%, using an MgO insulator, and TMR values around 200% are now found routinely in simple structures. More recently, TMR values over 1000% at room temperature have been observed under special conditions.

The experimental situation with regard to GMR is significantly different. Despite massive industry and academic efforts over nearly two decades, the GMR value has not budged over about 20% for simple structures. Values of GMR around 100% have been achieved in a class of so-called superlattices (i.e., multi-period structures with many periods of a repeating pattern of magnetic layers separated by non-magnetic layers), but this class of structures requires very large switching fields that are impractically large for commercially viable devices.

It may seem therefore that TMR should be the effect of choice for devices and systems based on magnetoresistance. There is, however, a compelling reason for using GMR rather than TMR. Though TMR-based devices are expected to be viable down to near submicron features, thermal stability of QMR devices becomes a significant issue at the deep submicron level, and this issue is much more readily addressed using GMR than TMR.

Resistance of the simplest GMR structure—two magnetic layers separated by a non-magnetic metal spacer such as chromium (Cr), copper (Cu), or ruthenium (Ru)—is relatively low if the two magnetizations are parallel, relatively high if anti-parallel. This is the case irrespective of whether the exchange coupling between the two layers is ferromagnetic or anti-ferromagnetic.

There is an exchange coupling between two magnetic layers through the non-magnetic spacer between them. Exchange coupling is an indirect interaction mechanism of the magnetic layers mediated by the non-magnetic spacer layer. This coupling can be either ferromagnetic or anti-ferromagnetic. If the former, the direction of magnetization (also referred to herein as the magnetization vector) of the two magnetic layers tend to be aligned or parallel in the low-energy or ground state (e.g., in the absence of an external magnetic field), i.e., the low-resistance configuration. By contrast, for GMR structures in which the exchange coupling is anti-ferromagnetic, the magnetization vectors tend to be anti-parallel in the ground state, i.e., the high-resistance configuration.

If the coupling is anti-ferromagnetic, it is possible to realize parallel alignment of the magnetization vectors, and therefore the GMR effect, by saturating the structure. Superlattices (structures having many multilayer periods, e.g., >about 50 periods) in which the exchange coupling is anti-ferromagnetic have been shown to have large values of GMR but, if the anti-ferromagnetic coupling is very strong, the magnetic fields necessary to drive the structures to saturation are impractically large for use in commercially viable systems or devices, e.g., on the order of 10,000 Oersteds (Oe).

The current understanding of the nature of the exchange coupling in GMR structures—ferromagnetic or anti-ferromagnetic—is as an oscillatory function of spacer thickness, with the strength of the coupling decreasing with increasing thickness of the non-magnetic layers separating the magnetic layer. See, for example, FIG. 1 in which a coupling field $H_e$ is shown as a function of copper spacer thickness for a [Cu/Co]×50 lattice. Positive $H_e$ corresponds to spacer thicknesses which results in anti-ferromagnetic coupling. Negative $H_e$ corresponds to spacer thicknesses which results in ferromagnetic coupling. FIG. 2 shows GMR (lower plot) as a function of spacer thickness for the [Co/Cu]×50 lattice of FIG. 1. As shown, for spacer thicknesses corresponding to the ferromagnetic coupling regions of the structure, no GMR effect is observed. The four small graphs in FIG. 2 show the normalized magnetization of the two magnetic layers as a function of applied magnetic field in kilo-Oersteds.

SUMMARY OF THE INVENTION

An interface across which ferromagnetic coupling acts, and across which the relative magnetizations of two magnetic structures can be changed by an applied current, either directly or through the magnetic field it produces, to produce the giant magnetoresistance (GMR) effect is referred to herein as an "active interface."

According to specific embodiments, a multi-layer structure includes a plurality of multi-layer periods. Each multi-layer period includes a first structure having a plurality of magnetic layers separated by intervening non-magnetic layers. The plurality of magnetic layers includes outer magnetic layers. The first structure is characterized by anti-ferromagnetic coupling between adjacent ones of the magnetic layers, and has an overall magnetization orientation that is antiparallel with magnetization orientations of the outer magnetic layers. A second structure is adjacent and separated from the first structure by an intervening non-magnetic layer. The second structure includes one or more magnetic layers. Each second structure has an active magnetic interface with the outer magnetic layer of one or more adjacent first structures. The active magnetic interface is characterized by ferromagnetic coupling. When relative magnetization orientations across each active magnetic interface are reversed, a resistance of the multi-layer structure changes. According to specific embodiments, the change in resistance results from the giant magnetoresistance effect.

In one class of embodiments, the first structure is characterized by a higher coercivity than the second structure. In another class of embodiments, the second structure is characterized by a higher coercivity than the first structure.

In some embodiments, each second structure comprises one magnetic layer. In other embodiments, each second structure comprises a plurality of magnetic layers alternating with non-magnetic layers. According to at least some of these embodiments, the second structure is characterized by anti-ferromagnetic coupling between adjacent ones of its magnetic layers.

According to specific embodiments, a multi-layer structure includes a plurality of multi-layer periods. Each multi-layer period includes a triad structure having three magnetic layers separated by intervening non-magnetic layers. The magnetic layers include a middle magnetic layer and two outer magnetic layers. The triad structure is characterized by anti-ferromagnetic coupling between the middle and outer magnetic layers, and has an overall magnetization orientation that is parallel with a magnetization orientation of the middle magnetic layer. A monad structure is adjacent and separated from the triad structure by an intervening non-magnetic layer. The monad structure includes one magnetic layer. Each monad structure has an active magnetic interface with the outer magnetic layer of one or more adjacent triad structures. The active magnetic interface is characterized by ferromagnetic coupling. When relative magnetization orientations across each active magnetic interface are reversed, a resistance of the multi-layer structure changes. According to specific embodiments, the change in resistance results from the giant magnetoresistance effect.

In one class of embodiments, the triad structure is characterized by a higher coercivity than the monad structure. In another class of embodiments, the monad structure is characterized by a higher coercivity than the triad structure.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

According to various embodiments of the invention, multi-period GMR structures are provided in which the exchange coupling across the active interfaces of the structure is ferromagnetic.

Figure 1:
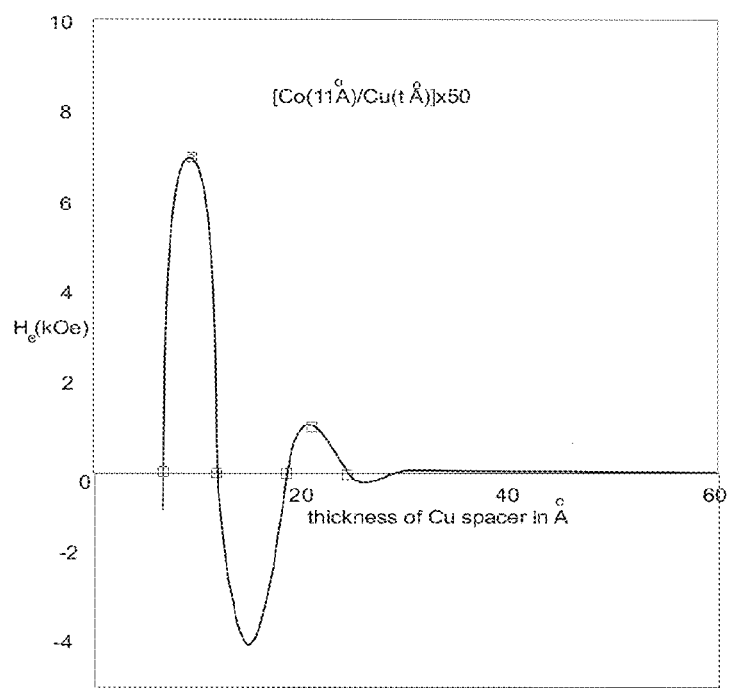
FIG. 1 is a graph illustrating exchange coupling field as a function of spacer thickness in a conventional multi-period lattice structure.
Figure 2:
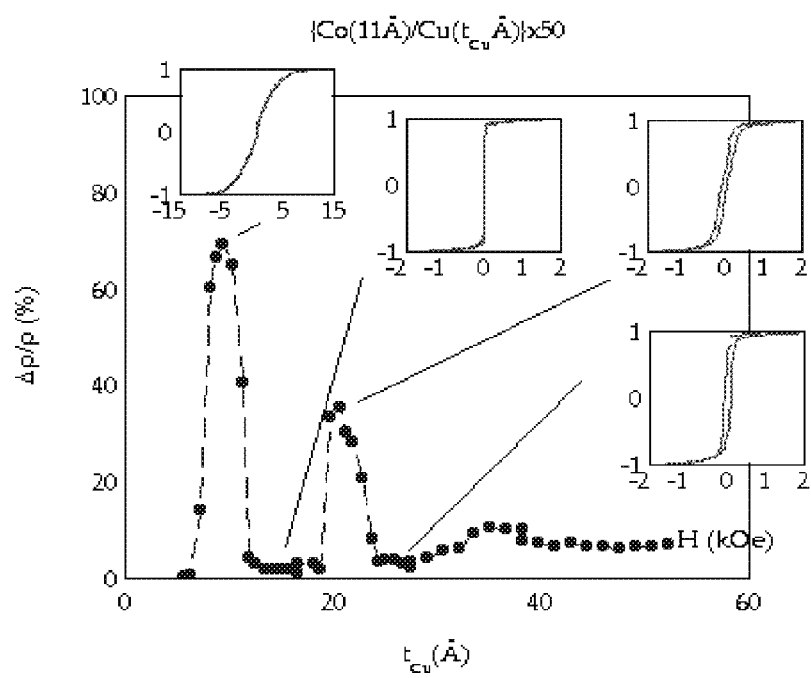
FIG. 2 is a graph illustrating GMR values as a function of spacer thickness in the structure represented by FIG. 1.
Figure 3:
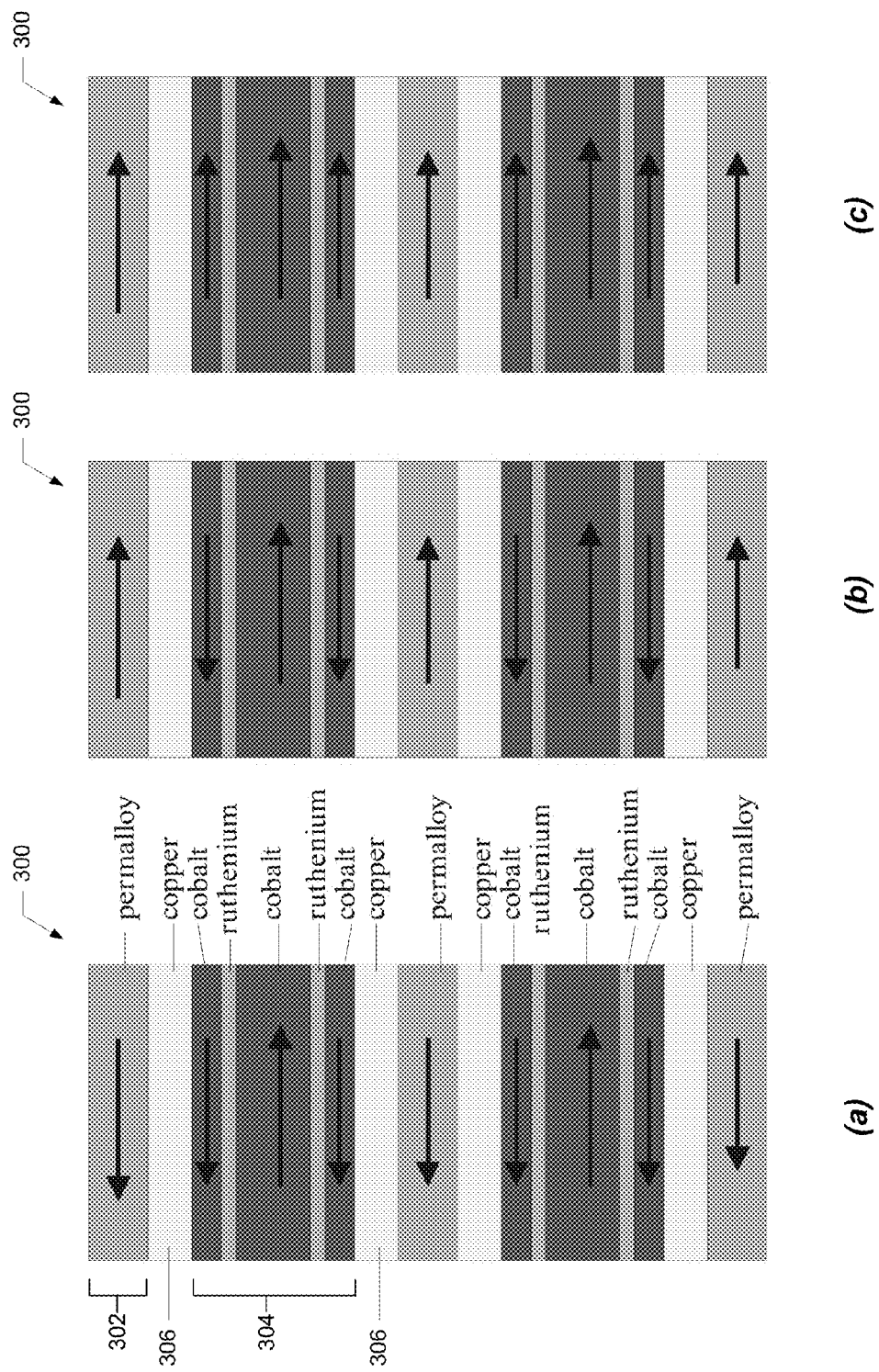
FIG. 3 shows three magnetization states of a multi-period structure designed in accordance with a specific embodiment of the invention.

In giant magnetoresistance (GMR) structures designed in accordance with various embodiments of the invention, an interface across which ferromagnetic coupling acts, and across which the relative magnetizations of two magnetic structures can be changed by an applied current, either directly or through the magnetic field it produces, to produce the GMR effect is referred to herein as an "active interface." Examples of active interfaces are the interfaces between the permalloy layers and the outer cobalt layers of the triad structures of FIG. 3 described below. According to various embodiments, the applied magnetic fields sufficient to produce the GMR effect have magnitudes suitable for commercially viable implementations, e.g., below about 100 Oe and, in some implementations within the range of about 5 to 20 Oe.

By contrast, an interface across which the relative magnetizations of two layers do not change during device operation is referred to herein as a "passive interface." Examples of passive interfaces are the anti-ferromagnetic interfaces between the middle and outer cobalt layers of the triad structure of FIG. 3. As will be discussed, the fields required to switch the relative magnetizations across passive interfaces are significantly higher than for active interfaces, e.g., multiple orders of magnitude greater.

Each period of a GMR structure designed in accordance with specific embodiments of the invention includes at least two different species of magnetic structures and one or more intervening non-magnetic layers between the different species of structures. An example of such a GMR structure 300 is shown in FIG. 3. As shown, each period of GMR structure 300 includes a structure 302 (implemented in this example as a monad structure with a single permalloy layer) and a structure 304 (implemented in this example as a triad structure with three cobalt layers separated by two layers of ruthenium).

Magnetic structures 302 and 304 are separated by intervening non-magnetic material 306 (implemented in this example with a single copper layer) It should be noted that these specific structures and materials are being presented by way of example, and that embodiments are contemplated in which the monad may be replaced by a multi-layer structure, and/or in which the triad may be a more complex multi-layer structure. Similarly, the materials shown are merely examples of materials which may be employed to implement multi-period GMR structures in accordance with the invention. The scope of the invention should therefore not be limited by reference to the specific structures and materials shown in and described with reference to FIG. 3.

Each magnetic structure 304 in GMR structure 300 is itself an anti-ferromagnetic structure in which the overall direction of the magnetization is defined by the middle cobalt layer, i.e., the middle layer of the triad is thicker and thus has a higher magnetic moment than the magnetic moments of the outer layers of the triad combined. That is, spacer thicknesses are chosen such that the coupling between the layers of the triad is anti-ferromagnetic with the magnetizations of the two outer layers opposite to that of the middle layer. The anti-ferromagnetic coupling is sufficiently strong such that the triad acts as a single entity in response to applied fields that are within practical operating ranges (e.g., below about 100 Oe). For example, a ruthenium spacer layer of 6-7 Å between two cobalt layers results in an anti-ferromagnetic coupling that requires many thousands of Oersteds to establish parallel alignment between the two magnetizations.

According to a particular class of implementations, the triad parameters are chosen so that its resulting overall net magnetization is parallel to that of its middle layer, i.e. opposite to that of its outer layers. This requires that $m_2 > m_1 + m_3$, where m is the magnetic moment (magnetization times volume) of the material, and the subscripts 1, 2, and 3 refer to the outer, middle, and outer magnetic layers, respectively. In the case illustrated in FIG. 3, i.e., in which all three layers are constructed of the same material, the thickness, $t_2$, of the middle layer must be greater than the combined thicknesses of the outer layers to meet this constraint, i.e., $t_2 > t_1 + t_3$. However, this thickness requirement may be relaxed where different materials are used for the middle and outer layers, i.e., higher magnetization for the middle layer than for the outer layers. Such embodiments would be particularly advantageous as GMR values increase with the number of active interfaces per unit superlattice thickness.

The thickness of the spacer between the monad and the triad is chosen so as to couple the monad magnetization and the magnetization of the outer layer of the triad ferromagnetically. At zero field or a small reverse field, this ferromagnetic coupling will set the magnetizations of the monad and the outer triad layer to parallel alignment.

And although GMR structures designed according to embodiments of the invention include magnetic structures in which the coupling is anti-ferromagnetic (e.g., the triad structures of FIG. 3), the active interfaces of these GMR structures are between the different species of magnetic structures in each period (e.g., between the permalloy layers and the outer cobalt layers of the adjacent triads in FIG. 3). These active interfaces are characterized by ferromagnetic coupling.

Referring again to the GMR structure illustrated in FIG. 3, combining the triad, with its strong internal anti-ferromagnetic coupling, and the monad, with its relatively weaker ferromagnetic coupling to the outer triad layer, introduces into the structure an intermediate exchange-coupling region. Drive fields too small to break the anti-ferromagnetic coupling within the triad are strong enough to overcome the ferromagnetic coupling between the monad and the outer triad layer, i.e. to drive the ferromagnetically-coupled magnetizations into antiparallel alignment, thereby realizing the GMR effect. And by implementing one of the two structures (i.e., either the monad or the triad) as having a coercivity lower than that of the other, the magnetization of the lower-coercivity structure may be reversed without affecting the magnetization of the higher-coercivity structure.

FIG. 3(a) illustrates the ground state of GMR structure 300 in which the magnetization of the permalloy monad is parallel with the magnetization of the outer cobalt layers of the triad, i.e., the magnetization vectors point in the same direction, as is characteristic of ferromagnetic coupling. This orientation may be reversed to the antiparallel orientation of FIG. 3(b) with a relatively low applied magnetic field (e.g., below about 100 Oe). As can be seen in FIG. 3(b), in this example, the monad is the lower-coercivity structure. GMR structure 300 has a relatively low resistance for parallel magnetizations of the monad and the outer layers of the anti-ferromagnetic structures, and a higher resistance for antiparallel magnetizations of the two. The ground state of the GMR structure is thus the low-resistance state.

The transition between the configuration of FIG. 3(a) and that of FIG. 3(b) is produced by a field large enough to reverse the monad (lower-coercivity) magnetization, but not that of the triad as a whole (higher coercivity). Pseudo spin valves have previously been applied by IME to devices in which both the lower-coercivity structure and the higher-coercivity structure have a dynamical role. For example, a pseudo spin valve has been used in SpinRAM®, a magnetic RAM in which the higher-coercivity layer is used for storage and the lower-coercivity layer for nondestructive readout; and in a Transpinnor®-based switch in which the higher-coercivity layer functions to set the switch and the lower-coercivity layer to operate it. In some embodiments employing multi-period GMR structures designed in accordance with the invention and in which both the triad and the monad structures have a dynamical role, the triad typically functions as the higher-coercivity structure and the monad as the lower-coercivity structure. It is possible, however, to engineer anti-ferromagnetic structures such as the triad with very low coercivity; much lower than that of permalloy. In devices based on such structures and in which both the higher-coercivity structure and the lower-coercivity structure have a dynamical role, the triad may function as the lower-coercivity structure and the monad as the higher-coercivity structure. The operating fields in the resulting devices are significantly lower than in those in which the triad functions as the higher-coercivity structure and the monad as the lower-coercivity structure.

Embodiments are also contemplated in which the monad structure is replaced by an engineered triad structure with sufficiently different coercivity from that of the other triad structure to have suitable operating margins for switching of the lower-coercivity structure without switching the higher-coercivity structure, each of which is characterized by a significantly lower coercivity than the monad structure of FIG. 3. This approach can lead to yet further reduction of the operating fields.

According to some embodiments, this second triad structure is also characterized by anti-ferromagnetic coupling between adjacent ones its magnetic layers. According to specific ones of these embodiments, the second triad structure is subject to the magnetic moment constraints discussed above with respect to the first triad structure. However, embodiments are contemplated in which such constraints are not required for the second triad structure.

Referring again to FIG. 3 and in contrast with the transition between the states illustrated in FIGS. 3(a) and 3(b), in order to drive all of the layers of the monads and triads to have the same orientation as shown in FIG. 3(c), a very large field (e.g., on the order of 10,000 Oe) must be applied to overcome the strong anti-ferromagnetic coupling of the layers of the triad, further emphasizing the unsuitability of anti-ferromagnetic GMR superlattice structures for practical applications.

According to various embodiments of the invention, various combinations of magnetic materials known to those of skill in the art can be chosen for the different species of magnetic structures in each period of the overall GMR structure. For example, both structures may be constructed using cobalt, or both with permalloy. Alternatively, one structure may be constructed with cobalt and the other with permalloy. And as mentioned above, different magnetic materials may be used within the anti-ferromagnetic structure in each period. Examples of magnetic materials that may be suitable for use with various embodiments of the invention include, but are not limited to, Fe, NiFe (permalloy), Co (cobalt), FeCo, and CoFeB. Likewise, various non-magnetic materials can be used for the spacers including, but not limited to, Cu (copper) and Ru (ruthenium) as shown in FIG. 3, as well as Cr (chromium).

As mentioned above, the ground state of GMR structure 300 shown in FIG. 3(a) has relatively low resistance. The ferromagnetic exchange coupling across the copper spacer causes the magnetizations of the permalloy layer and the nearest cobalt layers to tend to be parallel. This state may occur spontaneously in zero applied field, or may require a small pulse to establish. The fully antiparallel state shown in FIG. 3(b) has relatively high resistance. It may be realized by applying a magnetic field that reverses the permalloy layer but leaves the magnetization of the triad intact. That is, the relative triad magnetizations are held in place by the anti-ferromagnetic exchange across the ruthenium spacer, and the triad as a whole does not switch because, in this example, the triad is the higher-coercivity structure and the applied field is not sufficient to overcome the triad coercivity.

Multi-period GMR structures having alternating monad and triad magnetic structures similar to the structure illustrated in FIG. 3 (with the monad being constructed from cobalt rather than permalloy) have been fabricated and tested with encouraging results. The triad structures showed very strong internal anti-ferromagnetic coupling. By introducing the triad structure into each period of the overall structure, making the net magnetization of the triad opposite to that of its outer layers, and making the magnetizations of the outer layers of the triad in the ground state of the overall structure parallel to that of the second species of magnetic structure in each period, e.g., the monad, the regions of zero GMR by which previous single-species lattices are characterized were eliminated. That is, GMR has been achieved with ferromagnetic coupling in a structure that enables operation of devices based on the structure to employ drive fields within practical operating ranges.

Figure 4:
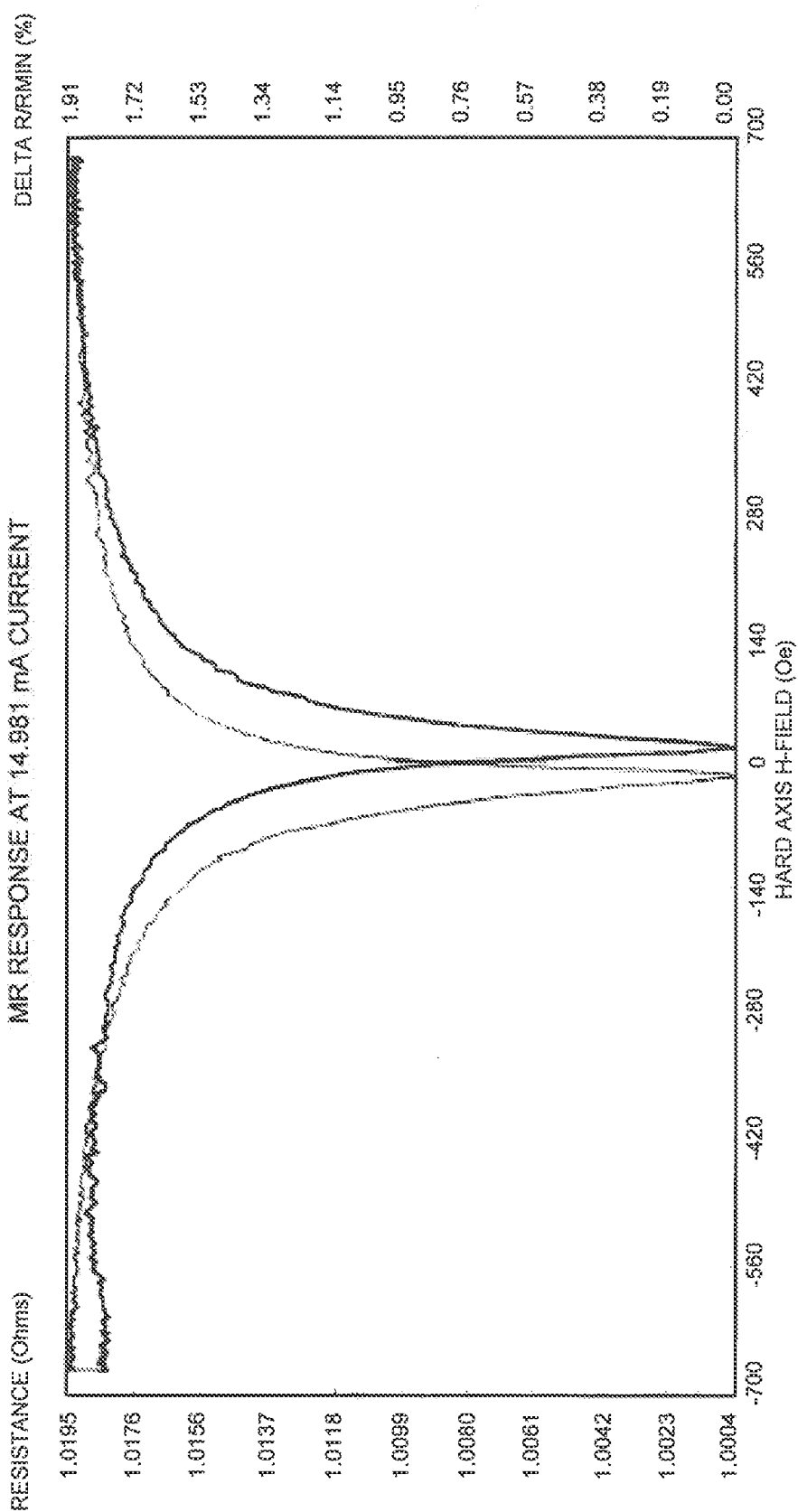
FIG. 4 is a graph illustrating experimental results for a multi-period structure designed in accordance with a specific embodiment of the invention.

The experimental R-H (resistance vs. applied magnetic field) curve for a GMR structure implemented in accordance with a specific embodiment of the invention is shown in FIG. 4. It should be noted that the curve of FIG. 4 is inverted relative to the R-H curve of structures not employing multiple species of magnetic structures in each period, i.e., greater resistance at higher fields than at lower fields. It should also be noted that there was particularly good agreement between the theoretical and measured GMR values for the structure:

Si/SiO2/Ta50/Co50Cu40Co10/Ru8/Co40Ru8Co10/
Cu40/Co50Cu40Co10/Ru8/Co40Ru8Co10/Cu40/
Co50

The measured values of GMR for fabricated structures were small, as expected (see FIG. 4), because of the relatively small number of periods and the use of ruthenium for some of the spacers (as discussed below, copper spacers within each anti-ferromagnetic structure may result in higher GMR values). In any case, the experimental results obtained prove that multi-period GMR structures may be successfully implemented in which the exchange coupling across the active interfaces of the structure is ferromagnetic. Because of the agreement between experimental results and theoretical predictions, it is expected that GMR values will rise significantly as the number of periods in the overall structure becomes large due to the increase in the number of active interfaces. This is further supported by the fact that over 50 periods were required before the full GMR effect was observed in anti-ferromagnetic superlattices.

It is also expected that the low drive fields with which the GMR effect may be observed in structures constructed according to embodiments of the invention will persist as the number of periods increases. This is due to the fact that the required strength of the drive field is determined in relation to the ferromagnetic coupling the field has to overcome. This should not change significantly as the number of periods in the structure increase as long as the active interfaces are well separated from one another.

Computer modeling also suggests that the user of copper spacers within the anti-ferromagnetic structures in each period should yield higher GMR values, e.g., on the order of 50%, as compared to implementations which employ ruthenium which should yield GMR values more on the order of 14%. The likely reason is that copper has higher conductivity. An important factor in raising GMR values for a given choice of materials will likely be the number, per unit thickness, of active interfaces. Reduction in the thickness of the magnetic structures in each period is therefore important.

Multi-period structures implemented in accordance with various embodiments of the invention may be used to implement a wide variety of systems and devices. For example, such multi-period structures may be used to implement memory cells. Examples of memory cells that may be implemented using the structures described herein are described in U.S. Pat. No. 5,587,943, U.S. Pat. No. 6,594,175, and U.S. Patent Publication No. 2008/0285331 A1, each of which is incorporated herein by reference in its entirety for all purposes.

According to some embodiments, the binary state of a memory cell implemented according to a specific embodiment may be represented by the overall magnetization of the higher-coercivity structures within the overall structure. In such implementations, the write field is sufficiently strong to set this magnetization while maintaining the structure's internal anti-ferromagnetic coupling and much lower (preferably orders of magnitude) than what is required to saturate the entire structure. The read field is weaker still, being only strong enough to switch the lower-coercivity structures within the overall structure to determine whether the alignment of the outer-layer magnetizations across the active interface is parallel or antiparallel by observing the change in resistance.

Figure 5:
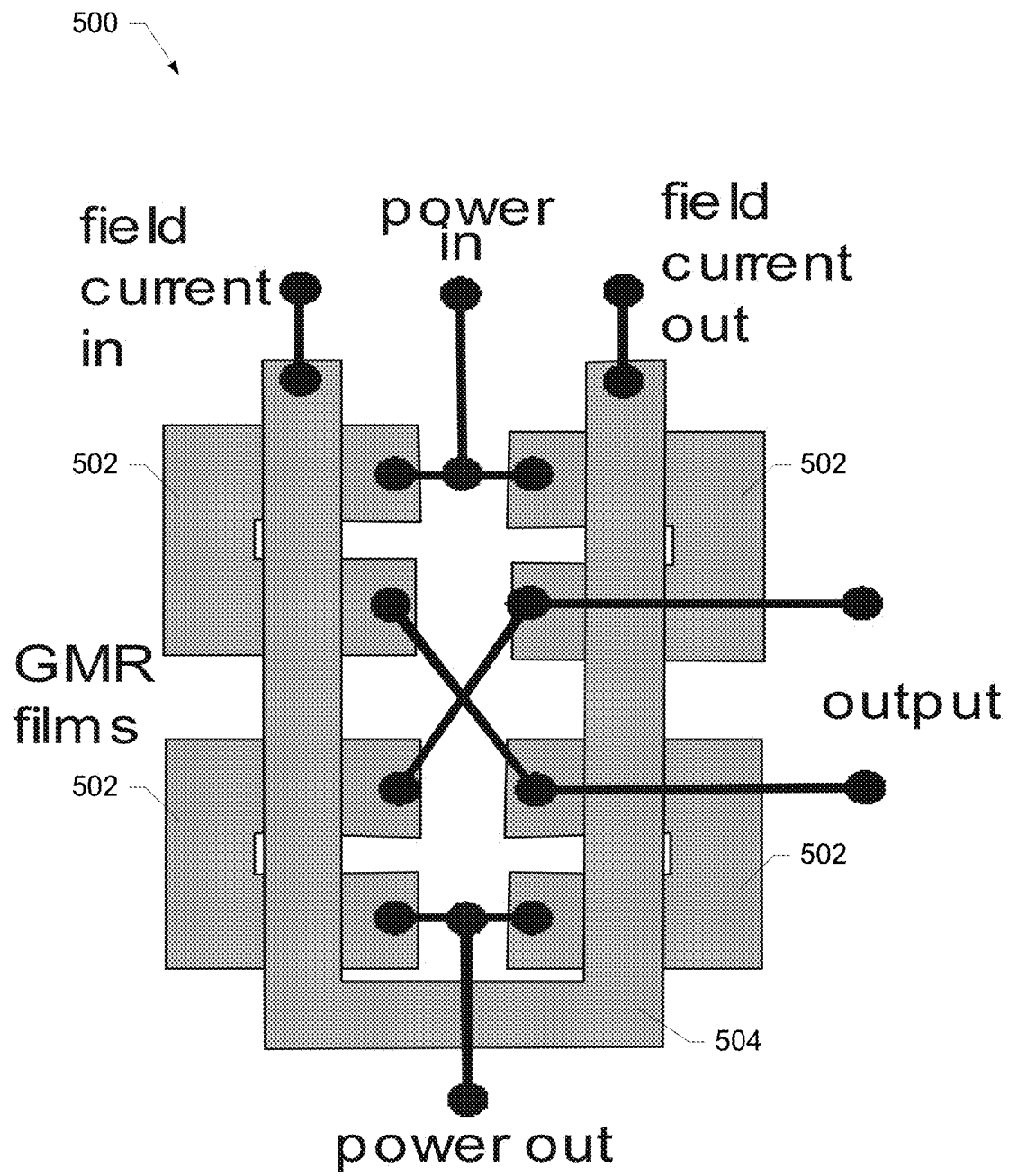
FIG. 5 is a simplified representation of a solid-state component implemented using a multi-period structure designed in accordance with a specific embodiment of the invention.

In other examples, multi-period structures implemented in accordance with various embodiments of the invention may be used to implement solid-state components which may be the basis for a wide variety of magnetic and electronic circuits, devices, and systems. FIG. 5 shows a simplified, schematic representation of such a solid-state component, Transpinnor® 500, in which four multi-period GMR structures 502 are disposed in a bridge configuration. It should be noted that only one of structures 502 needs to be a GMR structure, i.e., 1 to 3 of the structures may be replaced with resistors. A stripline 504 is inductively coupled to (and typically electrically insulated from) GMR structures 502 for supplying a magnetic field thereto. An input current in stripline 504 produces a magnetic field that controls the orientation of the magnetic layers in multi-period GMR structures 502, and thereby the resistance of those structures and the output voltage and current. The stripline current operates the device; the power current is amplified.

The Transpinnor® has characteristics similar to both transistors and transformers. Like a transistor, it can be used for amplification, logic, or switching. Like a transformer, it can be used to step voltages and currents up or down, and the input is resistively isolated from the output, i.e., the only connection between input and output is inductively through a magnetic field so there is no low-frequency resistive path between input and output. Unlike ordinary transformers, a transpinnor has no low-frequency cutoff; the coupling is flat down to and including dc. The gain is proportional to the supply voltage (or current); doubling the supply voltage (or current) results in doubling both voltage output and current output.

Further examples of such solid-state components, as well as devices and systems incorporating such components, that may be implemented using structures constructed in accordance with embodiments of the invention, please refer to U.S. Pat. No. 5,929,636, U.S. Pat. No. 6,031,273, U.S. Pat. No. 6,469,927, U.S. Pat. No. 6,538,437, U.S. Pat. No. 6,573,713, U.S. Pat. No. 6,738,284, U.S. Pat. No. 6,859,063, U.S. Pat. No. 6,992,919, U.S. Pat. No. 7,005,852, U.S. Pat. No. 7,220,968, and U.S. Pat. No. 7,224,566, the entire disclosure of each of which is incorporated herein by reference for all purposes.

Figure 6:
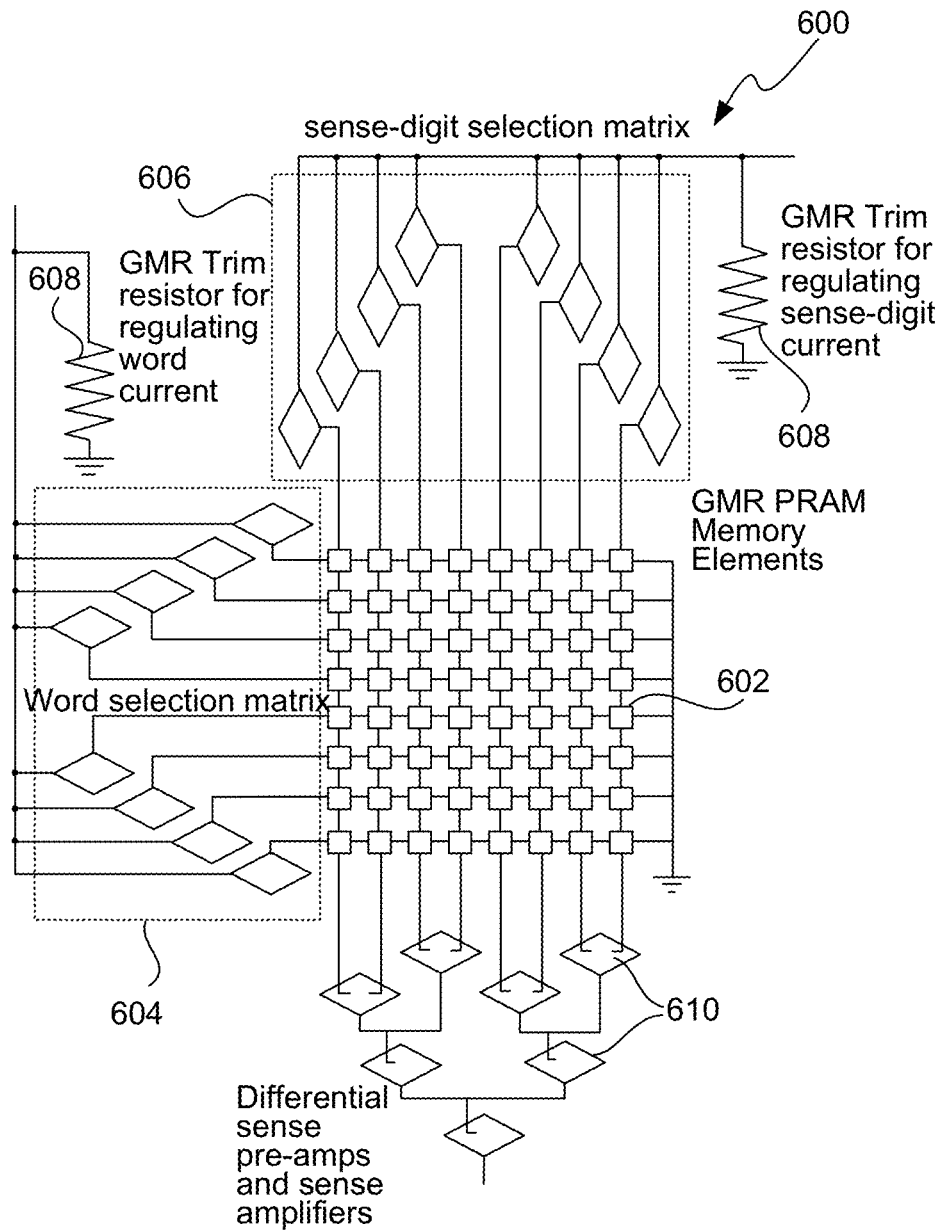
FIG. 6 is a simplified representation of a memory implemented using multi-period structures designed in accordance with one or more embodiments of the invention.

The foregoing paragraphs should also make it clear that multi-period structures designed in accordance with embodiments of the present invention may be used to partially or fully implement systems including both memory and electronics. FIG. 6 is a simplified diagram of an all metal random access memory 600, e.g., SpinRAM®, designed according to a specific embodiment. For the sake of clarity, only 64 memory cells 602 (which are implemented using multi-period structures as described herein) have been shown. It will be understood, however, that the simplified architecture of FIG. 6 may be generalized to any size memory array desired. It should also be noted that the control lines for the selection electronics have been omitted for the same purpose.

Transpinnors® based on the multi-period structures described herein form the basis for the all-metal support electronics for memory 600. Transpinnor®-based circuitry is used to select the word lines to be activated (604), the sense-digit and reference lines to activated (606), regulate the voltage to the drive lines (608), amplify the difference in current between selected sense-digit and reference line pairs (610), and perform further sense amplification in successive stages.

Examples of implementations of memories which may be implemented using memory cells and/or circuit components constructed using multi-period structures as described herein are described in U.S. Pat. No. 5,587,943, U.S. Pat. No. 6,469,927, U.S. Pat. No. 6,483,740, U.S. Pat. No. 6,594,175, and U.S. Pat. No. 6,992,919, the entire disclosure of each of which is incorporated herein by reference for all purposes.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A multi-layer structure, comprising:
a plurality of multi-layer periods, each multi-layer period including:
a first structure having a plurality of magnetic layers separated by intervening non-magnetic layers, the plurality of magnetic layers including outer magnetic layers, the first structure being characterized by anti-ferromagnetic coupling between adjacent ones of the magnetic layers, and having an overall magnetization orientation that is antiparallel with magnetization orientations of the outer magnetic layers; and
a second structure adjacent and separated from the first structure by an intervening non-magnetic layer, the second structure comprising one or more magnetic layers;
wherein each second structure has an active magnetic interface with the outer magnetic layer of one or more adjacent first structures, the intervening non-magnetic layer having a thickness such that the active magnetic interface is characterized by ferromagnetic coupling, and wherein when relative magnetization orientations across each active magnetic interface are reversed, a resistance of the multi-layer structure changes.

2. The multi-layer structure of claim 1 wherein the change in resistance results from the giant magnetoresistance effect.

3. The multi-layer structure of claim 1 wherein each first structure comprises three magnetic layers including the outer magnetic layers and a middle magnetic layer, the overall magnetization orientation of each first structure being parallel with a magnetization orientation of the middle magnetic layer.

4. The multi-layer structure of claim 3 wherein the outer and middle magnetic layers of each first structure are all constructed from a first magnetic material, and wherein a thickness of the middle magnetic layer of each first structure is greater than a combined thickness of the corresponding outer magnetic layers.

5. The multi-layer structure of claim 4 wherein the first magnetic material comprises one of Fe, NiFe, Co, FeCo, or CoFeB.

6. The multi-layer structure of claim 5 wherein the non-magnetic layers of each first structure comprise one of Cu, Ru, or Cr.

7. The multi-layer structure of claim 3 wherein the middle magnetic layer of each first structure is constructed from a first magnetic material and the corresponding outer magnetic layers are constructed from a second magnetic material different from the first magnetic material.

8. The multi-layer structure of claim 7 wherein a thickness of the middle magnetic layer of each first structure is less than a combined thickness of the corresponding outer magnetic layers.

9. The multi-layer structure of claim 7 wherein the first magnetic material comprises one of Fe, NiFe, Co, FeCo, or CoFeB, and the second magnetic material comprises one of Fe, NiFe, Co, FeCo, or CoFeB.

10. The multi-layer structure of claim 1 wherein each second structure comprises a plurality of magnetic layers alternating with non-magnetic layers.

11. The multi-layer structure of claim 10 wherein each second structure is characterized by anti-ferromagnetic coupling between adjacent ones of the magnetic layers of the second structure.

12. The multi-layer structure of claim 1 wherein each second structure comprises one magnetic layer.

13. The multi-layer structure of claim 12 wherein the one magnetic layer of each second structure comprises one of Fe, NiFe, Co, FeCo, or CoFeB.

14. The multi-layer structure of claim 1 wherein the first structure is characterized by a higher coercivity than the second structure.

15. The multi-layer structure of claim 1 wherein the second structure is characterized by a higher coercivity than the first structure.

16. A multi-layer structure, comprising:
a plurality of multi-layer periods, each multi-layer period including:
a triad structure having three magnetic layers separated by intervening non-magnetic layers, the magnetic layers including a middle magnetic layer and two outer magnetic layers, the triad structure being characterized by anti-ferromagnetic coupling between the middle and outer magnetic layers, and having an overall magnetization orientation that is parallel with a magnetization orientation of the middle magnetic layer; and
a monad structure adjacent and separated from the triad structure by an intervening non-magnetic layer, the monad structure comprising one magnetic layer;
wherein each monad structure has an active magnetic interface with the outer magnetic layer of one or more adjacent triad structures, the intervening non-magnetic layer having a thickness such that the active magnetic interface is characterized by ferromagnetic coupling, and wherein when relative magnetization orientations across each active magnetic interface are reversed, a resistance of the multi-layer structure changes.

17. The multi-layer structure of claim 16 wherein the change in resistance results from the giant magnetoresistance effect.

18. The multi-layer structure of claim 17 wherein the outer and middle magnetic layers of each triad structure are all constructed from a first magnetic material, and wherein a thickness of the middle magnetic layer of each triad structure is greater than a combined thickness of the corresponding outer magnetic layers.

19. The multi-layer structure of claim 18 wherein the first magnetic material comprises one of Fe, NiFe, Co, FeCo, or CoFeB.

20. The multi-layer structure of claim 19 wherein the non-magnetic layers of each triad structure comprise one of Cu, Ru, or Cr.

21. The multi-layer structure of claim 16 wherein the middle magnetic layer of each triad structure is constructed from a first magnetic material and the corresponding outer magnetic layers are constructed from a second magnetic material different from the first magnetic material.

22. The multi-layer structure of claim 21 wherein a thickness of the middle magnetic layer of each triad structure is less than a combined thickness of the corresponding outer magnetic layers.

23. The multi-layer structure of claim 21 wherein the first magnetic material comprises one of Fe, NiFe, Co, FeCo, or CoFeB, and the second magnetic material comprises one of Fe, NiFe, Co, FeCo, or CoFeB.

24. The multi-layer structure of claim 16 wherein the one magnetic layer of each monad structure comprises one of Fe, NiFe, Co, FeCo, or CoFeB.

25. The multi-layer structure of claim 16 wherein the triad structure is characterized by a higher coercivity than the monad structure.

26. The multi-layer structure of claim 16 wherein the monad structure is characterized by a higher coercivity than the triad structure.

27. A memory array comprising a plurality of the multi-layer structure of claim 1 configured as memory cells, the memory array having columns and rows, each column and each row corresponding to one of a plurality of access lines configured to individually access each of the multi-layer structures in the array, the memory array further comprising control electronics for applying currents to the access lines to effect reading and writing of individual memory cells in the memory array.

28. The memory array of claim 27 wherein the control electronics are implemented using solid-state components, selected ones of the solid-state components comprising one or more of the multi-layer structures of claim 1.

29. A solid-state component, comprising:
a network of resistive elements, the network having a plurality of nodes, each node representing a direct electrical connection between two of the resistive elements, first and second nodes of the plurality of nodes comprising power terminals, and third and fourth nodes of the plurality of nodes comprising an output, wherein at least a first one of the resistive elements comprises a multi-layer structure, comprising:
a plurality of multi-layer periods, each multi-layer period including:
a first structure having a plurality of magnetic layers separated by intervening non-magnetic layers, the plurality of magnetic layers including outer magnetic layers, the first structure being characterized by anti-ferromagnetic coupling between adjacent ones of the magnetic layers, and having an overall magnetization orientation that is antiparallel with magnetization orientations of the outer magnetic layers; and
a second structure adjacent and separated from the first structure by an intervening non-magnetic layer, the second structure comprising one or more magnetic layers;
wherein each second structure has an active magnetic interface with the outer magnetic layer of one or more adjacent first structures, the intervening non-magnetic layer having a thickness such that the active magnetic interface is characterized by ferromagnetic coupling, and wherein when relative magnetization orientations across each active magnetic interface are reversed, a resistance of the multi-layer structure changes; and
a first input conductor inductively coupled to the first resistive element for applying a first magnetic field thereto;
wherein the network of resistive elements and the first input conductor are configured such that the solid-state component is operable to receive an input current on the first conductor and, in response to the input current, to generate an output signal at the output which is a function of the input current and which is substantially proportional to a power current applied via the power terminals.

* * * * *